United States Patent
Wang et al.

(10) Patent No.: US 12,255,269 B2
(45) Date of Patent: Mar. 18, 2025

(54) LIGHT EMITTING DEVICE

(71) Applicant: XIAMEN SAN'AN OPTOELECTRONICS CO., LTD., Fujian Province (CN)

(72) Inventors: Huining Wang, Fujian (CN); Hongwei Xia, Fujian (CN); Quanyang Ma, Fujian (CN); Jiali Zhuo, Fujian (CN); Weibin Shi, Fujian (CN); Su-Hui Lin, Fujian (CN); Renlong Yang, Fujian (CN); Chung-Ying Chang, Fujian (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 452 days.

(21) Appl. No.: 17/867,419

(22) Filed: Jul. 18, 2022

(65) Prior Publication Data

US 2023/0026786 A1  Jan. 26, 2023

(30) Foreign Application Priority Data

Jul. 20, 2021 (CN) .......................... 202110820138.6

(51) Int. Cl.
*H01L 33/40* (2010.01)
*H01L 33/32* (2010.01)
*H01L 33/42* (2010.01)

(52) U.S. Cl.
CPC ............ *H01L 33/405* (2013.01); *H01L 33/42* (2013.01); *H01L 33/32* (2013.01)

(58) Field of Classification Search
CPC ........ H01L 33/405; H01L 33/42; H01L 33/32
See application file for complete search history.

(56) References Cited

U.S. PATENT DOCUMENTS

| | | | | |
|---|---|---|---|---|
| 2010/0308366 A1* | 12/2010 | Kang | .................... | H01L 33/405 257/E33.013 |
| 2013/0168721 A1* | 7/2013 | Hori | ..................... | H01L 33/405 257/98 |

(Continued)

FOREIGN PATENT DOCUMENTS

| CN | 211350683 | 8/2020 |
|---|---|---|
| CN | 113130718 A | 7/2021 |

OTHER PUBLICATIONS

Search Report appended to an Office Action, which was issued to Chinese counterpart application No. 1 202110820138.6 by the CNIPA on Jul. 14, 2022, with an English translation thereof.

(Continued)

*Primary Examiner* — Mark W Tornow
(74) *Attorney, Agent, or Firm* — Muncy, Geissler, Olds & Lowe, P.C.

(57) ABSTRACT

A light-emitting device includes a light-emitting laminated structure, a first electrode, and a second electrode. The first electrode has a reflection layer, an intermediate layer, and an electrically conductive layer. The intermediate layer includes a barrier layer having a first repeating paired layer unit and a second repeating paired layer unit, each of which has a platinum layer. The first repeating paired layer unit is closer to the electrically conductive layer than the second repeating paired layer unit, and a thickness of the platinum layer of the first repeating paired layer unit is greater than a thickness of the platinum layer of the second repeating paired layer unit.

20 Claims, 6 Drawing Sheets

(56) References Cited

U.S. PATENT DOCUMENTS

| | | | |
|---|---|---|---|
| 2019/0189851 A1* | 6/2019 | He | H01L 33/007 |
| 2021/0135428 A1* | 5/2021 | Hamaguchi | H01S 5/34333 |
| 2021/0384707 A1* | 12/2021 | Tanaka | H01S 5/18361 |
| 2022/0139970 A1* | 5/2022 | Kim | H01L 27/1248 |
| | | | 257/72 |

OTHER PUBLICATIONS

Search Report appended to an Office Action, which was issued to Chinese counterpart application No. 202110820138.6 by the CNIPA on Apr. 2, 2022 with an English translation thereof.

* cited by examiner

LIGHT EMITTING DEVICE

CROSS-REFERENCE TO RELATED APPLICATION

This application claims priority of Chinese Patent Application No. 202110820138.6, filed on Jul. 20, 2021.

FIELD

The present disclosure relates to a semiconductor optoelectronic device, and more particularly to a light-emitting device.

BACKGROUND

Light-emitting diode is a type of semiconductor optoelectronic device that may emit light by releasing energy in the form of photons upon recombination of electrons with electron holes. The light-emitting diode is widely applied in several fields because of its advantageous characteristics, e.g., low power consumption, long lifetime, and eco-friendly characteristics, etc.

Since electrodes of the light-emitting diode is configured to inject a current, a choice of a material and a structure of the electrodes would be important factors which affects performance thereof. In a conventional light-emitting diode, a material such as chromium, aluminum, and gold etc., are commonly used for producing the electrodes. However, since aluminum has a relatively strong activity, electromigration of aluminum might easily occur in the electrodes of the light-emitting diode under an environment of high temperature and high humidity, thus problems such as short circuit would occur easily. At present, in order to reduce electromigration in the electrodes of the light-emitting diode, an upper layer is usually formed on the aluminum layer to provide a covering effect to the aluminum layer. Gold is commonly used to form the upper layer of the electrode. However, since gold is likely to be miscible with aluminum in the aluminum layer, a reflectivity of the aluminum layer might be reduced, thereby reducing a light-emitting performance of the light-emitting diode.

SUMMARY

Therefore, an object of the disclosure is to provide a light-emitting device that can alleviate or overcome the aforesaid shortcomings of the prior art.

According to an aspect of the disclosure, a light-emitting device includes a light-emitting laminated structure, a first electrode, and a second electrode. The light-emitting laminated structure includes a first type semiconductor layer, a second type semiconductor layer, and an active layer that is interposed between the first type semiconductor layer and the second type semiconductor layer, and that is configured to emit a light. The first electrode is disposed on the light-emitting laminated structure, and is electrically connected to the first type semiconductor layer. The second electrode is disposed on the light-emitting laminated structure, and is electrically connected to the second type semiconductor layer. At least the first electrode includes a reflection layer, an electrically conductive layer, and an intermediate layer interposed between the reflection layer and the electrically conductive layer. The reflection layer is configured to reflect the light that is emitted by the active layer. The intermediate layer includes a barrier layer which has a plurality of repeating paired layer units. The plurality of repeating paired layer units include at least two repeating paired layer units that are referred to as a first repeating paired layer unit, and a second repeating paired layer unit. The first repeating paired layer unit is closer to the electrically conductive layer than the second repeating paired layer unit. Each of the first repeating paired layer unit and the second repeating paired layer unit includes a platinum layer. A thickness of the platinum layer of the first repeating paired layer unit is greater than a thickness of the platinum layer of the second repeating paired layer unit.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
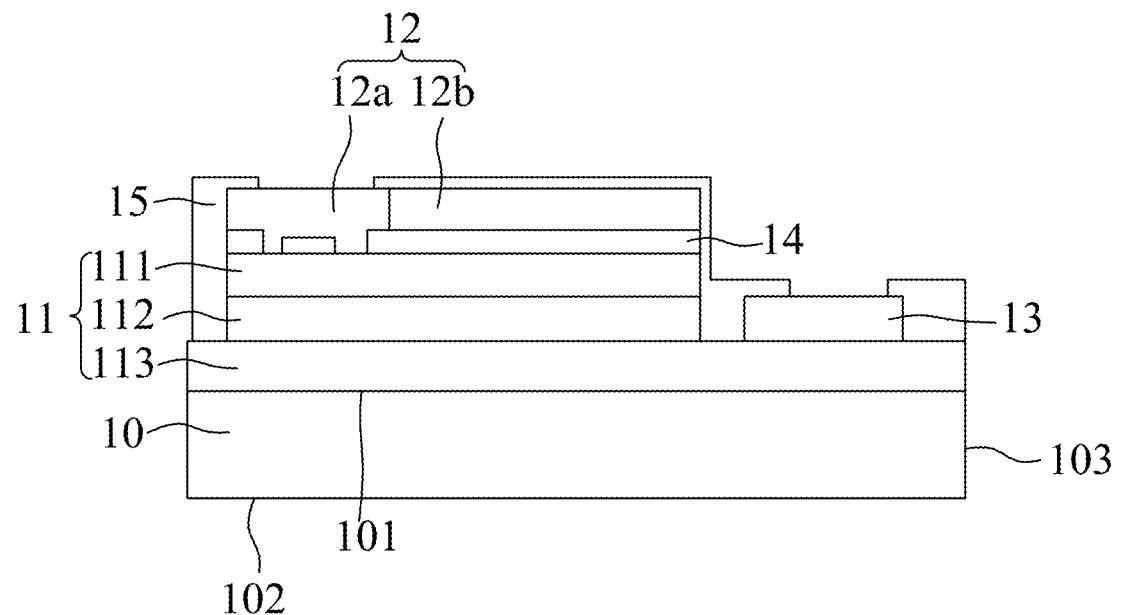
FIG. 1 is a schematic sectional view illustrating a first embodiment of a light emitting device according to the present disclosure.

Before the disclosure is described in greater detail, it should be noted that where considered appropriate, reference numerals have been repeated among the figures to indicate corresponding or analogous elements, which may optionally have similar characteristics.

It should be noted that, the formation of a first component over or on a second component in the description below may include embodiments in which the first and second components are formed in direct contact, and may also include embodiments in which additional components may be formed between the first and second components, such that the first and second components may not be in direct contact.

First Embodiment

FIGS. 1 to 5 illustrate a first embodiment of a light-emitting device according to the present disclosure.

Referring to FIG. 1, the first embodiment of the light-emitting device according to the present disclosure is configured as a lateral-chip type light-emitting device, and includes a substrate 10, a light-emitting laminated structure 11, a first electrode 12, and a second electrode 13.

The substrate 10 may be one of an insulating substrate and a conductive substrate. The substrate 10 may be a growth substrate for directly growing the light-emitting laminated structure 11 thereon. Examples of the substrate 10 include a sapphire ($Al_2O_3$) substrate, a silicon substrate, a silicon carbide substrate, etc. The light-emitting laminated structure 11 may be bonded to the substrate 10 through a bonding layer (not shown). In this embodiment, the substrate 10 has a first surface 101, a second surface 102 that is opposite to the first surface 101, and a side surface 103 that interconnects the first surface 101 and the second surface 102. In this embodiment, the substrate 10 may have a plurality of projections on a part of the first surface 101. For instance, the substrate 10 may be a patterned sapphire substrate with projections. In certain embodiments, the substrate 10 may be thinned or removed, so that the light-emitting device may be formed as a thin type light-emitting device.

Referring to FIG. 1, the light-emitting laminated structure 11 is formed on the first surface 101 of the substrate 10, and includes a first type semiconductor layer 111, a second type semiconductor layer 113, and an active layer 112 that is interposed between the first type semiconductor layer 111 and the second type semiconductor layer 113 and that is configured to emit a light. In this embodiment, the second type semiconductor layer 113 is disposed on the first surface 101 of the substrate 10, the active layer 112 is disposed on the second type semiconductor layer 113 opposite to the substrate 10, and the first type semiconductor layer 111 is disposed on the active layer 112. The light-emitting laminated structure 11 may be made of a gallium nitride-based material, a gallium arsenide-based material, or other suitable materials. Furthermore, the light-emitting laminated structure 11 may emit the light that has a predetermined wavelength (e.g., ultra violet light, blue light, green light, red light, and infrared light, etc.) by adjusting an elemental composition thereof.

The term "first type" refers to (a portion/layer of) the semiconductor layers 111, 113 being doped with a first conductivity type dopant, and the term "second type" refers to the semiconductor layers 111, 113 being doped with a second conductivity type dopant that is opposite in conductivity type to the first conductivity type dopant. For instance, the first conductivity type dopant may be a p-type dopant providing holes, and the second conductivity type dopant may be an n-type dopant providing electrons, and vice versa. In this embodiment, the first type semiconductor layer 111 is a p-type semiconductor layer, and the second type semiconductor layer 113 is an n-type semiconductor layer. In this embodiment, the active layer 112 may include a single quantum well structure or a multiple quantum well structure.

The first electrode 12 and the second electrode 13 are disposed on the light-emitting laminated structure 11. Referring to FIG. 1, the first electrode 12 is electrically connected to the first type semiconductor layer 111 of the light-emitting laminated structure 11, and the second electrode 13 is electrically connected the second type semiconductor layer 113 of the light-emitting laminated structure 11. It should be noted that, in this embodiment, the first electrode 12 is configured as a p-electrode that is connected to p-type semiconductor layer (i.e., the first type semiconductor layer 111), and the second electrode 13 is configured as an n-electrode that is connected to n-type semiconductor layer (i.e., the second type semiconductor layer 113).

Figure 2:
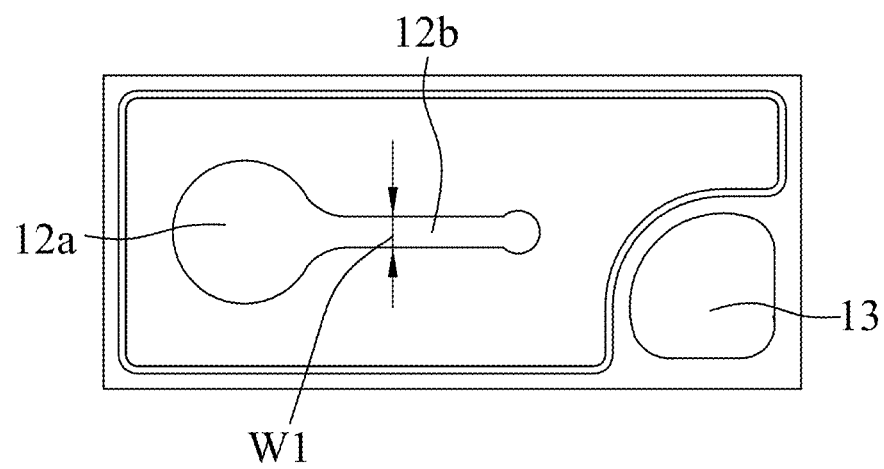
FIG. 2 is a schematic top view illustrating the first embodiment of the light emitting device.

Referring to FIGS. 1 and 2, in this embodiment, the first electrode 12 includes a pad part 12a and an extension part 12b that extends from a peripheral region of the pad part 12a. The pad part 12a may be a solder pad to be electrically connected to an external electronic devices (not shown in the figures) through a wire, and is formed to have a bump shape. The pad part 12a may have a circular bump shape or a rectangular bump shape, but is not limited to. The extension part 12b is formed to have a finger shape as shown in FIG. 2, and has a width (W1) ranging from 1 μm to 20 μm. It should be noted that, the first electrode 12 may be configured to have one or more of the extension part 12b based on requirements of current spreading effect.

Figure 3:
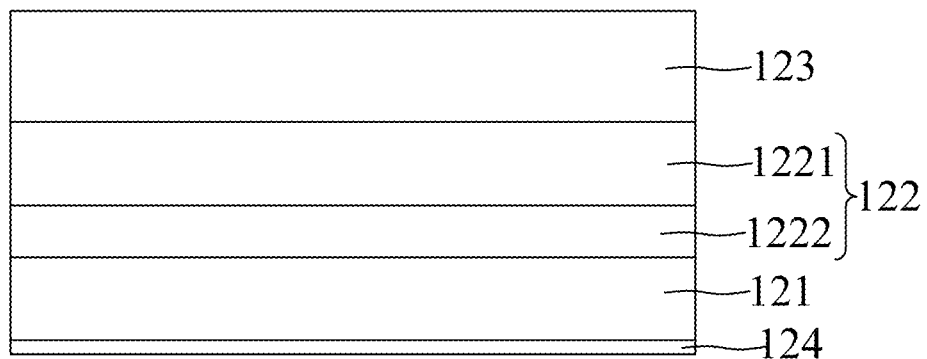
FIG. 3 is a schematic sectional view illustrating a first electrode of the first embodiment.

Referring to FIG. 3, the first electrode 12 includes a reflection layer 121, an electrically conductive layer 123, and an intermediate layer 122 that is interposed between the reflection layer 121 and the electrically conductive layer 123. The reflection layer 121 is positioned closer to the first type semiconductor layer 111, and is configured to reflect the light that is emitted by the active layer 112 of the light-emitting laminated structure 11. The electrically conductive layer 123 is disposed away from the first type semiconductor layer 111. In this embodiment, each of the pad part 12a and the extension part 12b includes the reflection layer 121, the intermediate layer 122, and the electrically conductive layer 123. In some embodiments, the reflection layer 121 has an aluminum layer, and the electrically conductive layer 123 has one of a gold layer and a gold-tin alloy layer. In this embodiment, the reflection layer 121 is the aluminum layer, and the electrically conductive layer 123 is the gold layer.

In some embodiments, referring to FIG. 3, the first electrode 12 further includes an ohmic contact layer 124 that is interposed between the reflection layer 121 of the pad part 12a of the first electrode and the light-emitting laminated structure 11, and that forms an ohmic contact with the light-emitting laminated structure 11. The ohmic contact layer 124 is configured to have less impact on the reflectivity of the reflection layer 121. The ohmic contact layer 124 may have a thickness of not greater than 10 nm (e.g., 1 nm to 8 nm), and may be made of nickel, chromium, and a combination thereof. Furthermore, in certain embodiments, the ohmic contact layer 124 may also be interposed between the reflection layer 121 of the extension part 12b of the first electrode 12 and the light-emitting laminated structure 11.

Referring to FIG. 3, the intermediate layer 122 includes a barrier layer that is formed to separate the reflection layer 121 from the electrically conductive layer 123 so as to prevent miscibility therebetween, i.e., the miscibility of aluminum and gold. The barrier layer has a plurality of repeating paired layer units.

In this embodiment, the plurality of repeating paired layer units includes at least two repeating paired layer units that are referred to as a first repeating paired layer unit 1221, and a second repeating paired layer unit 1222. The first repeating paired layer 1221 is closer to the electrically conductive layer 123 than the second repeating paired layer unit 1222. Furthermore, each of the first repeating paired layer unit 1221 and the second repeating paired layer unit 1222 includes a platinum layer, and a thickness of the platinum layer of the first repeating paired layer unit 1221 is greater than a thickness of the platinum layer of the second repeating paired layer unit 1222, such that the first repeating paired layer 1221 is thicker than the second repeating paired layer unit 1222. In some embodiments, each of the repeating paired layer units further includes a buffer metal layer that is paired with the platinum layer, and that has one of a nickel layer, a titanium layer, and a combination thereof.

Figure 4:
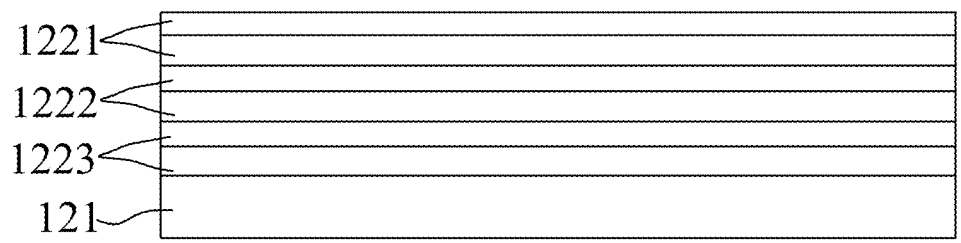
FIG. 4 is a schematic sectional view illustrating an intermediate layer of the first electrode of the first embodiment.
Figure 5:
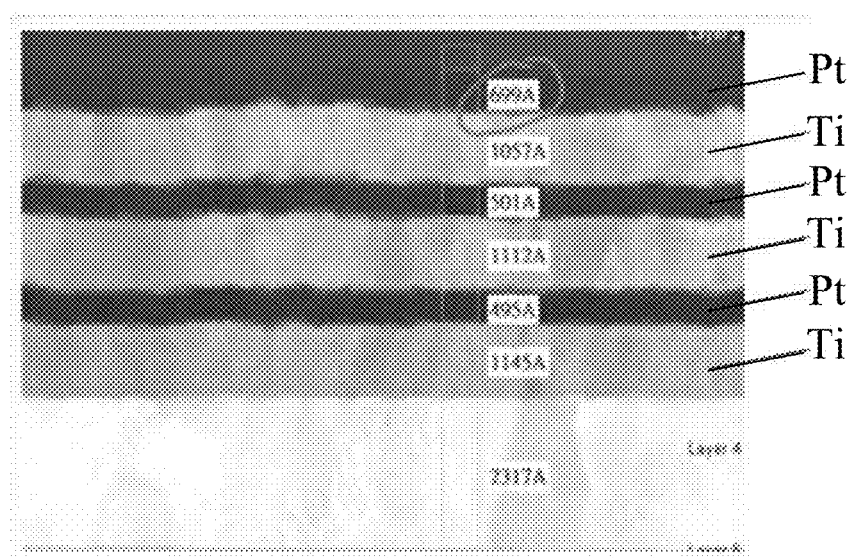
FIG. 5 is a transmission electron microscopy (TEM) image illustrating the intermediate layer of the first electrode of the first embodiment.

In some embodiments, referring to FIGS. 4 and 5, a number of the repeating paired layer units is greater than two, the first repeating paired layer unit 1221 is the closest to the electrically conductive layer 123, and the thickness of the platinum layer of the first repeating paired layer unit 1221 is greater than the thickness of the platinum layer of each of the remaining one of the repeating paired layer units (shown in FIG. 5). In certain embodiments, the number of the repeating paired layer units ranges from 2 to 5. In addition, the thickness of the platinum layer in each of the repeating paired layer units ranges from 20 nm to 150 nm, and the buffer metal layer in each of the repeating paired layer units has a thickness ranging from 40 nm to 200 nm.

FIGS. 4 and 5 illustrate an example in which the barrier layer includes three of the repeating paired layer units that are referred to as first repeating paired layer unit 1221, a second repeating paired layer unit 1222, and a third repeating paired layer unit 1223 respectively. Each of the repeating paired layer units 1221, 1222, 1223, includes a titanium layer as the buffer metal layer, and the platinum layer formed on the titanium layer, i.e., the barrier layer has a laminated structure containing titanium layer/platinum layer/titanium layer/platinum layer/titanium layer/platinum layer that are arranged in such order from the reflection layer 121 to the electrically conductive layer 123. Furthermore, in this case, the first repeating paired layer unit 1221 is the uppermost one of the repeating paired layer units, the third repeating paired layer unit 1223 is the lowermost one of the repeating paired layer units, and the second repeating paired layer 1222 is interposed therebetween. It should be noted that, since the platinum layer is mainly used for preventing miscibility between the reflection layer 121 (i.e., the aluminum layer) and the electrically conductive layer 123 (i.e., the gold layer), the platinum layer should have a certain thickness (i.e., ranging from 20 nm to 150 nm). Since platinum has a large stress, when the platinum layer is formed to have a relatively large thickness, cracking or a curling may occurred in the platinum layer. Thus, the titanium layer (i.e., buffer metal layer) is used to reduce the stress of the platinum layer so that the platinum layer with good quality can be obtained, thereby effectively avoiding miscibility of aluminum and gold. In comparison to aluminum, gold easily migrates, and miscibility usually occurs due to migration of gold in the electrically conductive layer 123 to the aluminum layer. Thus, the platinum layer of the first repeating paired layer unit 1221 that is the closest to the electrically conductive layer 123 is designed to have the thickness greater than the thicknesses of the platinum layers of the second and third repeating paired layer units 1222, 1223, thereby effectively preventing gold from migrating toward the aluminum layer. In addition, FIG. 5 is a transmission electron microscopy (TEM) image illustrating the structure of the barrier layer of the intermediate layer 122. As shown in FIG. 5, the thickness of the platinum layer of the first repeating paired layer unit 1221 is about 70 nm (700 Å), and each of the thickness of the platinum layer of the second and third repeating paired layer units 1222, 1223 is about 50 nm (500 Å).

In certain embodiments, the buffer metal layer may be a nickel layer. In this case, a configuration of the barrier layer is generally similar to that of the barrier layer having the titanium layer as the buffer metal layer, except for the following differences. The thickness of the platinum layer in each of the repeating paired layer units ranges from 50 nm to 150 nm, and the nickel layer of each of the repeating paired layer units has a thickness ranging from 40 nm to 200 nm. In certain embodiments, the barrier layer of the intermediate layer 122 is configured to have two of the repeating paired layer units and has a laminated structure containing nickel layer/platinum layer/nickel layer/platinum layer that are arranged in such order from the reflection layer 121 to the electrically conductive layer 123. The thickness of the platinum layer of the first repeating paired layer unit 1221 is about 120 nm, and the thickness of the platinum layer of the second repeating paired layer unit 1222 is about 95 nm.

In some embodiments, the barrier layer of the intermediate layer 122 includes titanium layer/platinum layer unit and nickel layer/platinum layer unit. In an exemplary embodiment, the barrier layer of the intermediate layer 122 has three repeating paired layer units, and has a laminated structure containing titanium layer/platinum layer/nickel layer/platinum layer/titanium layer/platinum layer that are arranged in such order from the reflection layer 121 to the electrically conductive layer 123. In this case, the thickness of the platinum layer of the first repeating paired layer unit 1221 is about 120 nm, and each of the thickness of the platinum layer of the second and third repeating paired layer units 1222, 1223 is about 95 nm.

Referring back to FIG. 1, in some embodiments, the light-emitting device further includes a transparent conductive layer 14 that is made of a material such as indium tin oxide (ITO), that covers most of a top surface of the first type semiconductor layer 111, and that is configured to enhance the current spreading effect in the horizontal direction. Furthermore, a part of the pad part 12a (e.g., an edge part of the pad part 12a) and the extension part 12b are formed on the transparent conductive layer 14. In such case, the ohmic contact layer 124 forms an ohmic contact with the transparent conductive layer 14. In certain embodiments, the light-emitting device further includes a current blocking layer (not shown in the figure) interposed between a part of the first type semiconductor layer 111 of the light-emitting laminated structure 11 and the transparent conductive layer 14.

As shown in FIG. 1, in some embodiments, the light-emitting device further includes a protection layer 15 that is made of an insulating material such as silicon oxide, silicon nitride, etc. The protection layer 15 covers a part of a top surface of the second type semiconductor layer 113 that is exposed from the active layer 112 and the second electrode 13, and a side wall of the active layer 112 and the first type semiconductor layer 111. In certain embodiments, the protection layer 13 further covers a part of the first and second electrodes 12, to prevent moisture from permeating into the light-emitting laminated structure 11. It should be noted that, at least a part of a top surface of the pad part 12a of the first electrode 12 is exposed from the protection layer 15 for external connection.

By virtue of the barrier layer of the intermediate layer 122 formed between the reflection layer 121 and the electrically conductive layer 123, the miscibility of aluminum and gold may be avoided, thus reliability of the light-emitting device may be increased.

Second Embodiment

FIGS. 6 to 10 illustrate a second embodiment of the light-emitting device according to the present disclosure.

Figure 6:
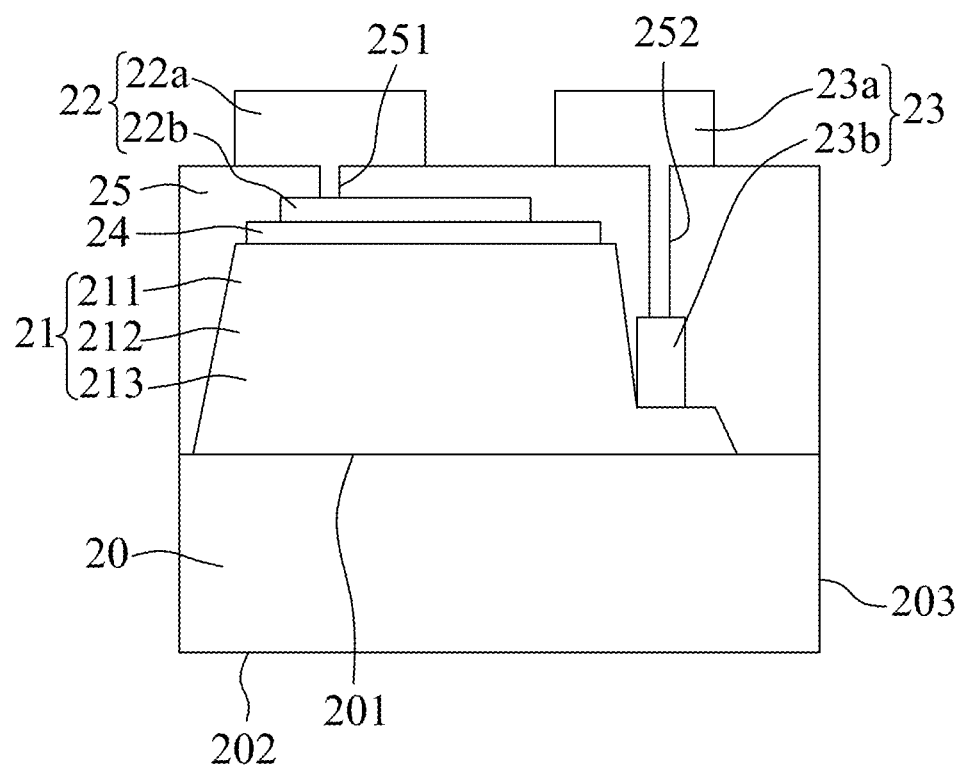
FIG. 6 is a schematic sectional view illustrating a second embodiment of a light emitting device according to the present disclosure.

Referring to FIG. 6, the second embodiment of the light-emitting device according to the present disclosure is configured as a flip-chip type light-emitting device, and includes a substrate 20, a light-emitting laminated structure 21, an insulation layer 25, a first electrode 22, and a second electrode 23.

The substrate 20 may be one of an insulating substrate and a conductive substrate. The substrate 20 may be a growth substrate for directly growing the light-emitting laminated structure 11 thereon, such as a sapphire ($Al_2O_3$) substrate, a silicon carbide substrate, a gallium arsenide substrate, a gallium nitride substrate, a zinc oxide substrate, a gallium phosphide substrate, a indium phosphide substrate, a germanium substrate, etc., but is not limited to. The light-emitting laminated structure may be bonded to the substrate 20 through a bonding layer (e.g., a light transmissive bonding layer, not shown). In this embodiment, the substrate 10 has a first surface 201, a second surface 202 that is opposite to the first surface 201 and that is a light exiting surface, and a side surface 203 that interconnects the first surface 201 and the second surface 202. For instance, the substrate 20 may be a patterned sapphire substrate that forms a plurality of projections on a part of the first surface 201. In this embodiment, the substrate 20 may be light transmissive.

The light-emitting laminated structure 21 is formed on the first surface 201 of the substrate 20, and includes a first type semiconductor layer 211, a second type semiconductor layer 213, and an active layer 212 that is interposed between the first type semiconductor layer 211 and the second type semiconductor layer 213 and that is configured to emit light. In the second embodiment, configurations (e.g., laminating order, doping type, and light-emitting mechanism, etc.) of the first type semiconductor layer 211, the active layer 212, and the second type semiconductor layer 213 are generally similar to the first type semiconductor layer 111, the active layer 112, and the second type semiconductor layer 113 of the first embodiment, respectively, and descriptions thereof are omitted herein for brevity.

Referring to FIG. 6, the insulation layer 25 covers a side wall and at least a part of top surface of the light-emitting laminated structure 21, and may be made of a material such as silicon oxide, silicon nitride, etc. In certain embodiments, the insulation layer 25 may be an insulating reflection layer, e.g., a distributed Bragg reflector (DBR) layer.

Figure 7:
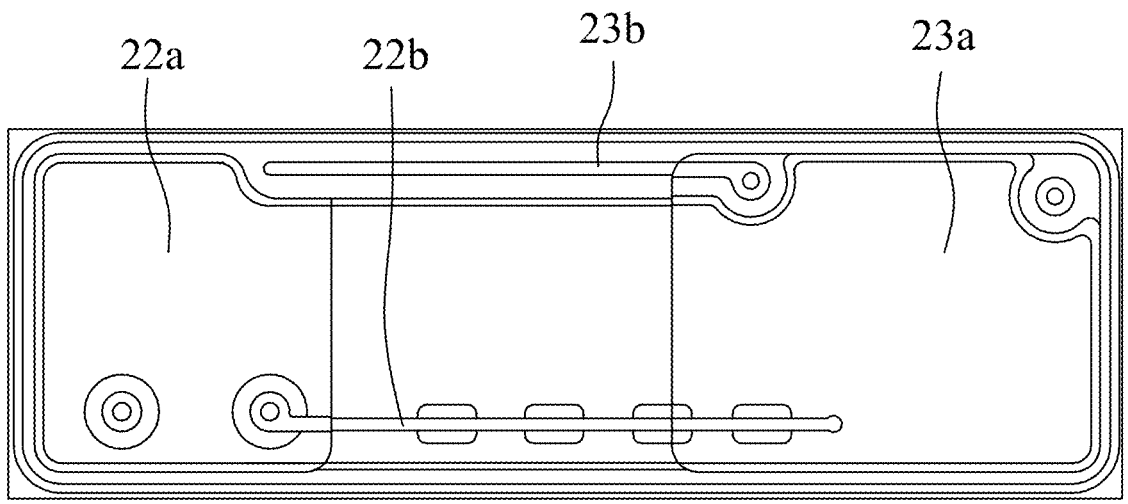
FIG. 7 is a schematic top view illustrating the second embodiment of the light emitting device.

Referring to FIGS. 6 and 7, each of the first electrode 22 and the second electrode 23 includes a pad part 22a, 23a disposed on a top surface of the insulation layer 25, and a contact part 22b, 23b covered by the insulation layer 25. The contact part 22b of the first electrode 22 contacts and is electrically connected to the first type semiconductor layer 211 of the light-emitting laminated structure 21, and the contact part 23b of the second electrode 23 contacts and is electrically connected to the second type semiconductor layer 213 of the light-emitting laminated structure 21. Furthermore, the insulation layer 25 has a first opening 251 to expose a part of the contact part 22b of the first electrode 22, and a second opening 252 to expose a part of the contact part 23b of the second electrode 23. A part of the pad part 22a of the first electrode 22 fills the first opening 251 of the insulation layer 25 and is electrically connected to the contact part 22b of the first electrode 22, and a part of the pad part 23a of the second electrode 23 fills the second opening 252 of the insulation layer 25 and is electrically connected to the contact part 23b of the second electrode 23. In this embodiment, the first electrode 22 is configured as a p-electrode, and the second electrode 13 is configured as an n-electrode.

Figure 8:
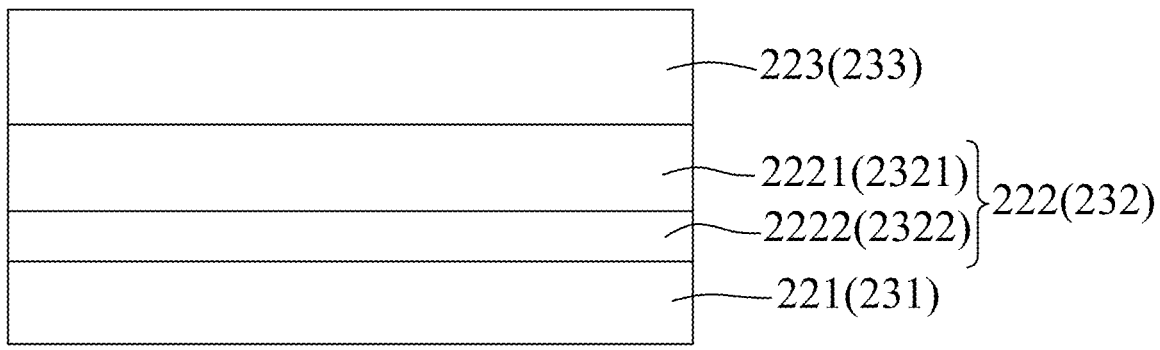
FIG. 8 is a schematic sectional view illustrating a structure of an electrode (e.g., a first electrode or a second electrode) of the second embodiment.

Referring to FIG. 8, the first electrode 22 includes a reflection layer 221, an electrically conductive layer 223, and an intermediate layer 222 interposed between the reflection layer 221 and the electrically conductive layer 223. The reflection layer 221 is positioned closer to the first type semiconductor layer 211, and is configured to reflect the light that is emitted by the active layer 212 of the light-emitting laminated structure 21. The electrically conductive layer 223 is disposed away from the first type semiconductor layer 211. The second electrode 23 has a structure similar to that of the first electrode 22, and also includes a reflection layer 231, an electrically conductive layer 233, and an intermediate layer 232 that is interposed between the reflection layer 231 and the electrically conductive layer 233. In each of first electrode 22 and the second electrode 23, the reflection layer 221, 231, the electrically conductive layer 223, 233, and the intermediate layer 222, 232 are similar to or the same as those of the first embodiment.

Referring to FIG. 8, each of the contact part 22b of the first electrode 22 and the contact part 23b of the second electrode 23 includes the reflection layer 221, 231, the intermediate layer 222, 232, and the electrically conductive layer 223, 233. Moreover, in certain embodiments, each of the pad part 22a of the first electrode 22 and the pad part 23a of the second electrode 23 also includes the reflection layer 221, 231, the intermediate layer 222, 232, and the electrically conductive layer 223, 233.

Figure 9:
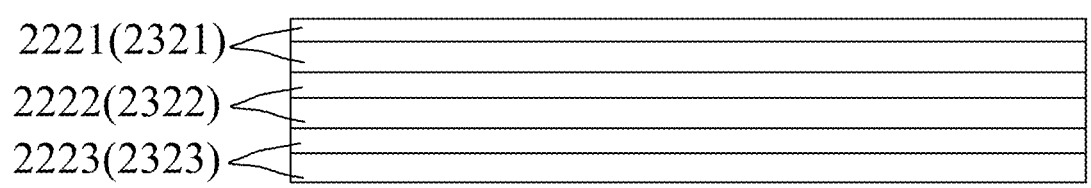
FIG. 9 is a schematic sectional view illustrating an intermediate layer of the electrode of the second embodiment.

FIG. 8 shows a configuration in which the barrier layer has two of the repeating paired layer units in the intermediate layer 222, 232 that are referred to as a first repeating paired layer unit 2221, 2321 and a second repeating paired layer unit 2222, 2322, respectively. FIG. 9 shows another configuration in which the barrier layer has three of the repeating paired layer units in the intermediate layer 222, 232 that are referred to as a first repeating paired layer unit 2221, 2321 a second repeating paired layer unit 2222, 2322 and a third repeating paired layer unit 2223, 2323, respectively. In this embodiment, in each of the repeating paired layer units, the thickness of the platinum layer ranges from 20 nm to 100 nm, and the thickness of the buffer metal layer ranges from 40 nm to 500 nm.

Figure 10:
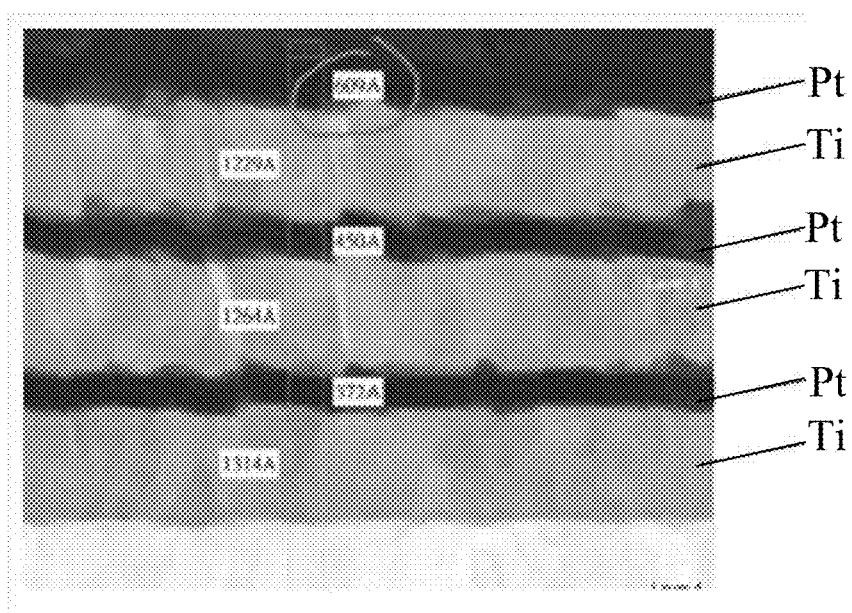
FIG. 10 is a TEM image illustrating the intermediate layer of the electrode of the second embodiment.

FIG. 10 is a TEM image illustrating the barrier layer of the intermediate layer 222, 232 having a titanium/platinum/titanium/platinum/titanium/platinum structure. As shown in FIG. 10, the thickness of the platinum layer of the first repeating paired layer unit 2221, 2321 is 609 Å, the thickness of the platinum layer of the second repeating paired layer unit 2222, 2322 is 450 Å, and the thickness of the platinum layer of the third repeating paired layer unit 2223, 2323 is 372 Å. In some embodiments, the barrier layer of the intermediate layer 222, 232 may have a titanium/platinum/nickel/platinum structure, i.e., titanium/platinum as the first repeating paired layer unit 2221, 2321, and nickel/platinum as the second repeating paired layer unit 2222, 2322. In this embodiment, the thickness of the platinum layer of the first repeating paired layer unit 2221, 2321 is about 150 nm, and the thickness of the platinum layer of the second repeating paired layer unit 2222, 2322 is about 120 nm.

Alternatively, in certain embodiments, each of the contact part 22b of the first electrode 22 and the contact part 23b of the second electrode 23 includes the aforesaid reflection layer 221, 231, a middle layer, and the aforesaid electrically conductive layer 223, 233. In each of the contact part 22b of the first electrode 22 and the contact part 23b of the second electrode 23, the middle layer is disposed between the reflection layer 221, 231 and the electrically conductive layer 223, 233, and is a single platinum layer having a thickness, e.g., 90 nm. In certain embodiments, the middle layer may further include a buffer metal layer that is a nickel layer or titanium layer.

In this embodiment, the reflection layer 221, 231 includes a plurality of aluminum layers and titanium layers which are alternately disposed one on another to form multiple stacked layer units. The thicknesses of the multiple stacked layer units of the reflection layer 221, 231 decrease sequentially from a light-emitting side to an electrode side of the light-emitting laminated structure 21. In some embodiments, the reflection layer 221, 231 has aluminum/titanium/aluminum/titanium/aluminum/titanium structure, i.e., three of the multiple stacked layer units that are referred to as a first multiple stacked layer that is the closest to the electrode side (the farthest from the light-exiting side), a second multiple stacked layer disposed on the first multiple stacked layer, and third multiple stacked layer disposed on the second multiple stacked layer opposite to the first multiple stacked layer (the closest to the light exiting side). In the third multiple stacked layer, a thickness of the aluminum layer is about 490 nm, and a thickness of the titanium layer is about 190 nm; in the second multiple stacked layer, the thickness of the aluminum layer is about 410 nm, and the thickness of the titanium layer is about 185 nm; and in the first multiple stacked layer, the thickness of the aluminum layer is about 405 nm, and the thickness of the titanium layer is about 175 nm.

Referring back to FIG. 6, in some embodiments, the light-emitting device further includes a transparent conductive layer 24. The transparent conductive layer 24 covers most of a top surface of the first type semiconductor layer 111 (e.g., at least 80% of the top surface), and is configured to enhance the current spreading effect in the horizontal direction. The transparent conductive layer 24 may be made of one of indium tin oxide (ITO), gallium tin oxide (GTO), gallium zinc oxide (GZO), zinc oxide (ZnO), and combinations thereof. In this embodiment, the contact part 22b of the first electrode 22 is electrically connected to the first type semiconductor layer 211 of the light-emitting laminated structure 21 through the transparent conductive layer 24. In certain embodiments, the light-emitting device further includes a current blocking layer (not shown in the figure) that is interposed between the first type semiconductor layer 211 of the light-emitting laminated structure 21 and the transparent conductive layer 24.

The light-emitting device of the second embodiment have the same effect as that of the first embodiment.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting device, comprising:
a light-emitting laminated structure which includes
a first type semiconductor layer,
a second type semiconductor layer,
an active layer interposed between said first type semiconductor layer and said second type semiconductor layer, and configured to emit a light,
a first electrode disposed on said light-emitting laminated structure, and electrically connected to said first type semiconductor layer,
a second electrode disposed on said light-emitting laminated structure, and electrically connected to said second type semiconductor layer,
wherein
at least said first electrode includes a reflection layer, an electrically conductive layer, and an intermediate layer interposed between said reflection layer and said electrically conductive layer,
said reflection layer is configured to reflect the light that is emitted by said active layer,
said intermediate layer includes a barrier layer which has a plurality of repeating paired layer units, the plurality of repeating paired layer units includes at least two repeating paired layer units that are referred to as a first repeating paired layer unit, and a second repeating paired layer unit, said first repeating paired layer unit is closer to said electrically conductive layer than said second repeating paired layer unit, each of said first repeating paired layer unit and said second repeating paired layer unit includes a platinum layer, a thickness of said platinum layer of said first repeating paired layer unit is greater than a thickness of said platinum layer of said second repeating paired layer unit.

2. The light-emitting device as claimed in claim 1, wherein each of said repeating paired layer units further includes a buffer metal layer that is paired with said platinum layer.

3. The light-emitting device as claimed in claim 2, wherein said buffer metal layer has one of a nickel layer, a titanium layer, and a combination thereof.

4. The light-emitting device as claimed in claim 2, wherein a number of said repeating paired layer units ranges from 2 to 5.

5. The light-emitting device as claimed in claim 2, wherein the thickness of said platinum layer in each of said repeating paired layer units ranges from 20 nm to 150 nm, and said buffer metal layer in each of said repeating paired layer units has a thickness ranging from 40 nm to 200 nm.

6. The light-emitting device as claimed in claim 2, wherein a number of said repeating paired layer units is greater than two, said first repeating paired layer unit is the closest to said electrically conductive layer, and the thickness of said platinum layer of said first repeating paired layer unit is greater than that of each of the remaining one of said repeating paired layer units.

7. The light-emitting device as claimed in claim 1, wherein said reflection layer has an aluminum layer, and said electrically conductive layer has one of a gold layer and a gold-tin alloy layer.

8. The light-emitting device as claimed in claim 1, wherein said light-emitting device is configured as a lateral-chip type light-emitting device, said first electrode includes a pad part, and an extension part that extends from a peripheral region of said pad part, each of said pad part and said extension part includes said reflection layer, said intermediate layer, and said electrically conductive layer.

9. The light-emitting device as claimed in claim 8, wherein said extension part of said first electrode has a width ranging from 1 μm to 20 μm.

10. The light-emitting device as claimed in claim 8, wherein said first electrode further includes an ohmic contact layer interposed between said reflection layer of said pad part of said first electrode and said light-emitting laminated structure.

11. The light-emitting device as claimed in claim 10, wherein said ohmic contact layer has a thickness of not greater than 10 nm.

12. The light-emitting device as claimed in claim 1, wherein said light-emitting device is configured as a flip-chip type light-emitting device, and further comprising an insulation layer, said light-emitting laminated structure has a top surface and a side wall, and said insulation layer covers said side wall and at least a part of said top surface of said light-emitting laminated structure.

13. The light-emitting device as claimed in claim 12, wherein each of said first electrode and said second electrode includes a pad part disposed on a top surface of said insulation layer, and a contact part covered by said insulation layer,
- said contact part of said first electrode is electrically connected to said first type semiconductor layer of said light-emitting laminated structure,
- said contact part of said second electrode is electrically connected to said second type semiconductor layer of said light-emitting laminated structure,
- said insulation layer has a first opening to expose a part of said contact part of said first electrode, and a second opening to expose a part of said contact part of said second electrode,
- a part of said pad part of said first electrode fills said first opening of said insulation layer and is electrically connected to said contact part of said first electrode, and a part of said pad part of said second electrode fills said second opening of said insulation layer and is electrically connected to said contact part of said second electrode.

14. The light-emitting device as claimed in claim 13, wherein each of said pad part of said first electrode and said pad part of said second electrode includes said reflection layer, said intermediate layer, and said electrically conductive layer.

15. The light-emitting device as claimed in claim 14, wherein said barrier layer of said intermediate layer of said pad part includes a plurality of said repeating paired layer units, each of said repeating paired layer units includes said platinum layer and a buffer metal layer.

16. The light-emitting device as claimed in claim 15, wherein said buffer metal layer has one of a nickel layer, a titanium layer, and a combination thereof.

17. The light-emitting device as claimed in claim 14, wherein each of said contact part of said first electrode and said contact part of said second electrode includes said reflection layer, said intermediate layer, and said electrically conductive layer.

18. The light-emitting device as claimed in claim 14, wherein each of said contact part of said first electrode and said contact part of said second electrode includes said reflection layer, a platinum layer, and said electrically conductive layer, and, in each of said contact part of said first electrode and said contact part of said second electrode, said platinum layer is disposed between said reflection layer and said electrically conductive layer.

19. The light-emitting device as claimed in claim 13, wherein said reflection layer includes a plurality of aluminum layers and titanium layers which are alternately disposed one on another to form multiple stacked layer units.

20. The light-emitting device as claimed in claim 19, wherein the thicknesses of said multiple stacked layer units of said reflection layer decrease sequentially from a light-emitting side to an electrode side of said light-emitting laminated structure.

\* \* \* \* \*